US011237220B2

(12) United States Patent
Rachala et al.

(10) Patent No.: US 11,237,220 B2
(45) Date of Patent: Feb. 1, 2022

(54) LINEAR, LOW-LATENCY POWER SUPPLY MONITOR

(71) Applicant: Advanced Micro Devices, Inc., Santa Clara, CA (US)

(72) Inventors: Ravinder Reddy Rachala, Austin, TX (US); Stephen Victor Kosonocky, Fort Collins, CO (US); Miguel Rodriguez, Golden, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 215 days.

(21) Appl. No.: 16/054,576

(22) Filed: Aug. 3, 2018

(65) Prior Publication Data

US 2020/0041577 A1 Feb. 6, 2020

(51) Int. Cl.
*G01R 31/40* (2020.01)
*G11C 27/02* (2006.01)
*H03K 17/687* (2006.01)
*G06F 1/3206* (2019.01)
*H03K 3/356* (2006.01)
*G06F 1/3296* (2019.01)
*H03K 3/03* (2006.01)

(52) U.S. Cl.
CPC ........... *G01R 31/40* (2013.01); *G06F 1/3206* (2013.01); *G06F 1/3296* (2013.01); *G11C 27/02* (2013.01); *H03K 3/0322* (2013.01); *H03K 3/356191* (2013.01); *H03K 17/687* (2013.01)

(58) Field of Classification Search
CPC ................. G01R 31/40; H03K 17/687; H03K 3/356191; H03K 3/0322
See application file for complete search history.

(56) References Cited

U.S. PATENT DOCUMENTS

| 7,898,278 | B2* | 3/2011 | Flynn | H02M 3/156 324/764.01 |
| 9,552,892 | B1 | 1/2017 | Kosonocky et al. | |
| 9,772,676 | B2 | 9/2017 | Kosonocky et al. | |
| 2005/0138450 | A1* | 6/2005 | Hsieh | G06F 8/4432 713/320 |
| 2008/0136474 | A1* | 6/2008 | Okada | H03L 7/0805 327/156 |
| 2008/0218195 | A1* | 9/2008 | Kajita | G01R 29/26 324/750.3 |

(Continued)

*Primary Examiner* — Jeff W Natalini
(74) *Attorney, Agent, or Firm* — Polansky & Associates, P.L.L.C.; Paul J. Polansky

(57) ABSTRACT

In one form, a power supply monitor including a current controlled oscillator circuit, a time-to-digital converter, and an output divider. The current controlled oscillator circuit has an input for receiving a power supply voltage to be measured, and an output for providing a frequency signal having a frequency linearly proportional to the power supply voltage. The time-to-digital converter has an input coupled to the output of the current controlled oscillator circuit, and an output for providing a count signal representative of a number of cycles of a reference clock signal per cycle of the frequency signal. The output divider has an input coupled to the output of the time-to-digital converter, and an output for providing a divided count signal representative of a value of the power supply voltage, and provides the divided count signal by dividing a fixed number by the count signal.

20 Claims, 5 Drawing Sheets

(56) References Cited

U.S. PATENT DOCUMENTS

| | | | |
|---|---|---|---|
| 2009/0051406 A1* | 2/2009 | Kawasaki | G01R 31/31721 327/419 |
| 2011/0074398 A1* | 3/2011 | Barton | G01R 19/0084 324/133 |
| 2012/0126847 A1 | 5/2012 | Kosonocky et al. | |
| 2014/0104005 A1* | 4/2014 | Zhang | H03K 3/0315 331/17 |
| 2015/0241955 A1* | 8/2015 | Kosonocky | G06F 1/3296 713/320 |

* cited by examiner

US 11,237,220 B2

LINEAR, LOW-LATENCY POWER SUPPLY MONITOR

BACKGROUND

Power-supply monitors are circuits used in large integrated circuit devices such as microprocessors and systems-on-chip (SOCs). They measure the power supply voltage at different places around the chip for purposes such as voltage regulation and power supply droop measurement. Power supply monitors need to provide accurate power supply measurements across the entire voltage and operating temperature ranges.

One known power supply monitor circuit uses a ring oscillator powered by a power supply voltage to be measured. The ring oscillator generates a high-frequency clock signal whose frequency varies based on the level of the power supply voltage. A counter counts the number of cycles of the ring oscillator over a counter period defined by a low-frequency clock signal. The count over the counter period corresponds to the measured power supply voltage. However because this technique uses the low-speed clock to sample the number of oscillations of the high-speed clock output by the ring oscillator, its latency is limited by the frequency of the low-speed clock signal.

Moreover, this power supply monitor circuit has a non-linear characteristic that reduces its sensitivity as the power supply voltage increases over its operating range. To overcome this problem, the power supply monitor may apply a post-monitor compensation based on a polynomial, such as a quadratic equation. The coefficients of the quadratic equation are measured per-chip and programmed into on-chip fuses. The coefficients may also be adjusted based on the actual operating temperature. Thus to avoid suffering from poor accuracy at higher power supply voltages, the power supply monitor requires many on-chip fuses to represent precise coefficients and requires calibration at factory test, both of which increase product cost.

Figure 1:
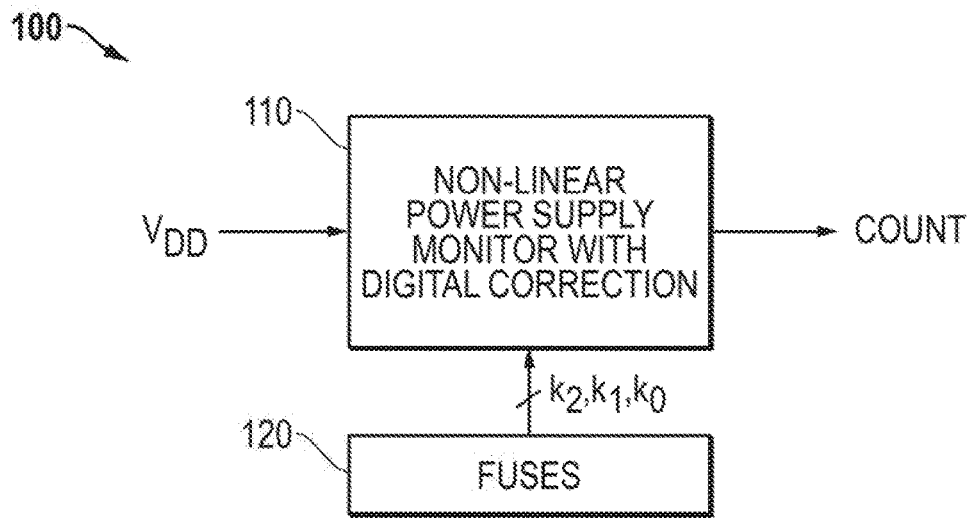
FIG. 1 illustrates in block diagram form a power supply monitor known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Additionally, the terms remap and migrate, and variations thereof, are utilized interchangeably as a descriptive term for relocating.

DETAILED DESCRIPTION OF ILLUSTRATIVE EMBODIMENTS

As will be described in detail below, in one form, a power supply monitor includes a current controlled oscillator circuit, a time-to-digital converter, and an output divider. The current controlled oscillator circuit has an input for receiving a power supply voltage to be measured, and an output for providing a frequency signal having a frequency linearly proportional to the power supply voltage. The time-to-digital converter has an input coupled to the output of the current controlled oscillator circuit, and an output for providing a count signal representative of a number of cycles of a reference clock signal per cycle of the frequency signal. The output divider has an input coupled to the output of the time-to-digital converter, and an output for providing a divided count signal representative of a value of the power supply voltage, wherein the output divider provides the divided count signal by dividing a fixed number by the count signal.

In another form, a power supply monitor includes a resistor, a first current mirror, a second current mirror, a current controlled oscillator, a time-to-digital converter, and an output divider. The resistor has a first terminal for receiving a power supply voltage to be measured, and a second terminal. The first current mirror has an input coupled to the second terminal of the resistor, and an output. The second current mirror has an input coupled to the output of the first current mirror, and an output. The current-controlled oscillator has an input coupled to the output of the second current mirror, and an output for providing a frequency signal. The time-to-digital converter has an input coupled to the output of the current controlled oscillator circuit, and an output for providing a count signal representative of a number of cycles of a reference clock signal per cycle of the frequency signal. The output divider has an input coupled to the output of the time-to-digital converter, and an output for providing a divided count signal representative of a value of the power supply voltage, wherein the output divider provides the divided count signal by dividing a fixed number by the count signal.

In yet another form, a method includes receiving a power supply voltage to be measured. A frequency signal having a frequency linearly proportional to the power supply voltage is generated. A count signal is provided representative of a number of cycles of a reference clock signal per cycle of the frequency signal. A fixed number is divided by the count signal to provide a divided count signal representative of a value of the power supply voltage.

FIG. 1 illustrates in block diagram form a power supply monitor 100 known in the prior art. Power supply monitor 100 includes a non-linear power supply monitor 110 with digital correction, and a set of fuses 120. Non-linear power supply monitor 110 has an input for receiving a power supply voltage to be measured labeled "$V_{DD}$", a control input, and an output for providing a signal labeled "COUNT". $V_{DD}$ is a power supply voltage terminal that is variable and has a voltage that is positive with respect to ground. Fuses 120 have outputs for providing values labeled "$k_2$", "$k_1$", and "$k_0$".

Non-linear power supply monitor 110 provides the COUNT as a digital value that corresponds to the level of $V_{DD}$. However, the voltage-to-count characteristic is non-linear and has a non-linear characteristic that reduces its sensitivity at higher values of $V_{DD}$. In particular, in order to make the COUNT a more linear representation of power supply voltage, non-linear power supply monitor 110 adjusts the transfer function to form the COUNT according to an inverse quadratic relationship to $V_{DD}$. In general, a quadratic equation takes the form:

$$y = k_2 x^2 + k_1 x + k_0 \qquad [1]$$

in which $k_2$, $k_1$, and $k_0$ are coefficients of the quadratic equation. By modeling the design, characterizing the design, or testing individual integrated circuits, a designer can obtain values for $k_2$, $k_1$, and $k_0$ and program them into fuses 120 at manufacturing final test to correct for the non-linearities and produce a substantially linear voltage-to-count characteristic.

However there are at least three practical problems with doing so. First, the optimal values of $k_2$, $k_1$, and $k_0$ are temperature dependent. Thus values that provide a high degree of linearity at one temperature do not provide a sufficiently high degree of linearity at a different temperature. Correction for temperature dependence requires changing the values of $k_2$, $k_1$, and $k_0$ based on the actual temperature. Second, because of the flattening effect, the compensation is more accurate during the steep part of the voltage-to-count transfer characteristic when power supply voltages are lower, but is less accurate during the flat part when power supply voltages are higher. For these higher values, it is more difficult to obtain suitable coefficients for accurate quadratic correction. Third, fuses 120 require extra circuit area and extra programming time during manufacturing final test.

Figure 2:
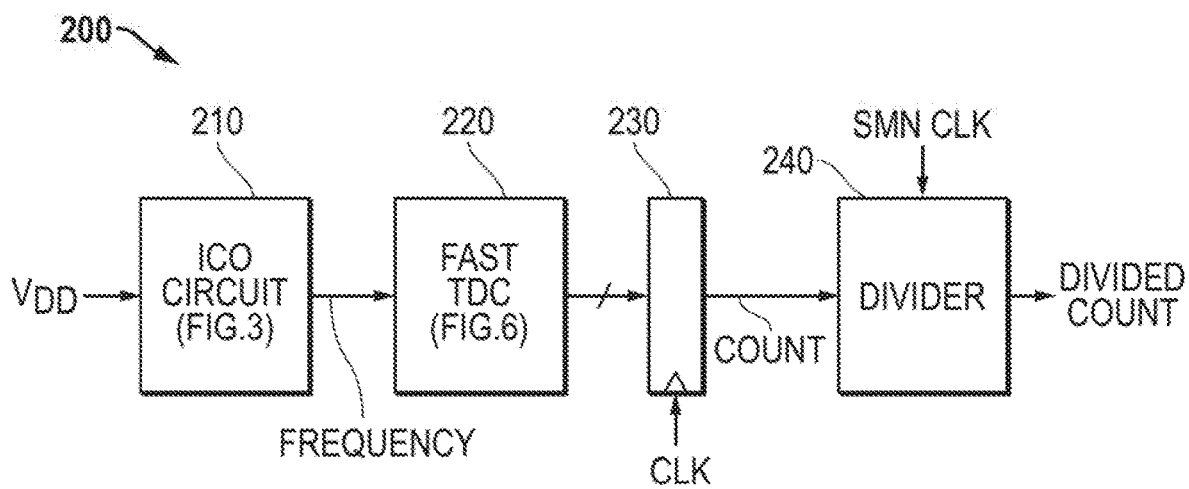
FIG. 2 illustrates in block diagram form a power supply monitor according to some embodiments.

FIG. 2 illustrates in block diagram form a power supply monitor 200 according to some embodiments. Power supply monitor 200 includes generally a current controlled oscillator circuit 210, a fast time-to-digital converter (TDC) 220, a synchronizer 230, and an output divider 240. Current controlled oscillator circuit 210 has an input for receiving power supply voltage $V_{DD}$, and an output for providing a clock signal labeled "FREQUENCY". Fast TDC 220 has an input connected to the output of current controlled oscillator circuit 210, and an output. Synchronizer has an input connected to the output of fast TDC 220, a clock input for receiving a clock signal labeled "CLK", and an output for providing count signal COUNT. Output divider 240 has an input connected to the output of synchronizer 230, a clock input for receiving a clock signal labeled "SMN CLK", and an output for providing a digital signal labeled "DIVIDED COUNT".

In general, current-controlled oscillator circuit 210 provides the FREQUENCY signal as a digital clock signal having a frequency linearly proportional to the value of $V_{DD}$. As used herein, a signal or quantity is linearly proportional to another signal or quantity if the two signals or quantities co-vary by a constant or nearly constant amount such that their relationship can be represented as a straight line in a graph. The FREQUENCY signal has the characteristic that it is a relatively high-speed clock signal over the full operating range of $V_{DD}$. In an exemplary embodiment, $V_{DD}$ can vary among a set of discrete values according to digital voltage and frequency scaling (DVFS) control. DVFS defines a set of different power states (P-states), each defining a unique voltage and frequency operating point. In one particular example, $V_{DD}$ can have nominal values of 0.5 volts (V), 0.7 V, 0.9 V, 1.1 V, and 1.3 V corresponding to certain operating frequencies, but can vary from the nominal values because of various conditions of the chip, such as power supply droop.

Fast TDC 220 receives the FREQUENCY signal, and provides a digital output that synchronizer 230 converts to the COUNT signal. Fast TDC 220 has relatively low latency that is limited only by the frequency of the FREQUENCY signal. In addition as will be described further below, fast TDC 220 does not have a linear transfer function. Instead it has a transfer function $f(x)$ that distorts the linear transfer function provided by current-controlled oscillator circuit 210 to result in an overall non-linear voltage-to-count response.

Output divider 240, however, corrects the distortion caused by fast TDC 220 by dividing a fixed number by the COUNT such that output divider 240 provides a $1/f(x)$ frequency response. Output divider 240 precisely compensates for the non-linearity introduced by fast TDC 220 to make the overall transfer function of power supply monitor 200 linear again. The fixed number can be any convenient number, such as 8192 ($2^{13}$). Thus power supply monitor 200 provides a linear voltage-to-divided count response with low latency and without the use of fuses and individual chip testing. The voltage-to-divided count response is stable with respect to temperature and there is no need to scale quadratic coefficients as temperature varies.

Output divider 240 is clocked by a relatively low-frequency clock, the SMN CLK. In the illustrated embodiment, an on-chip system management network (SMN) performs various control functions for a multi-core microprocessor and provides the SMN CLK over a low speed system management bus. Further details of the various components that can be used to implement power supply monitor 200 will now be described.

Figure 3:
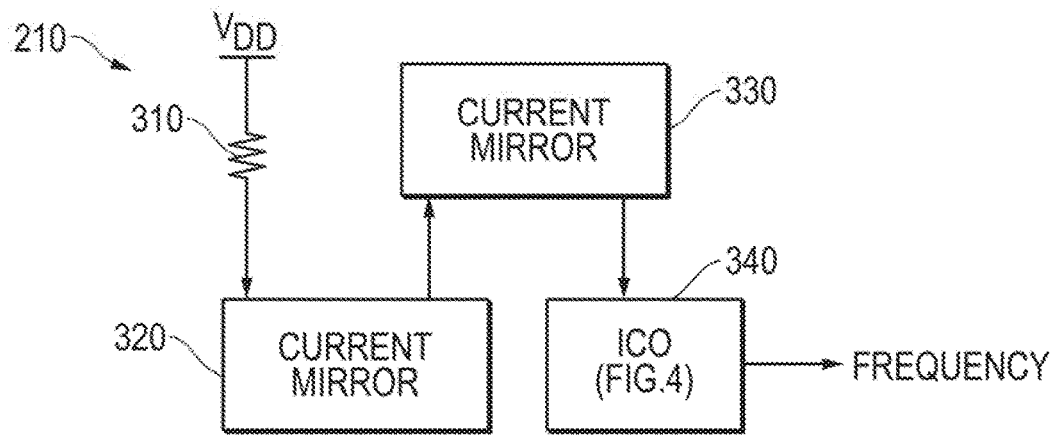
FIG. 3 illustrates in partial block diagram and partial schematic form the current controlled oscillator circuit of the power supply monitor of FIG. 2 according to some embodiments.

FIG. 3 illustrates in partial block diagram and partial schematic form current controlled oscillator circuit 210 of power supply monitor 200 of FIG. 2 according to some embodiments. Current controlled oscillator circuit 210 includes a resistor 310, a current mirror 320, a current mirror 330, and a current controlled oscillator 340 labeled "ICO". Resistor 310 has a first terminal connected to $V_{DD}$, and a second terminal. Current mirror 320 has an input terminal connected to the second terminal of resistor 310, and an output terminal. Current mirror 330 has an input terminal connected to the output terminal of current mirror 302, and an output terminal. Current controlled oscillator 340 has an input connected to the output of current mirror 330, and an output for providing the FREQUENCY signal.

Resistor 310 is used to set the current into the input of current mirror 310 according to the value of $V_{DD}$. Resistor 310 is a resistor with a low temperature coefficient. As used herein, a resistor with a low temperature coefficient is a resistor with less than 1000 parts per million per degree Celsius (ppm/° C.) temperature variability. Examples of low temperature coefficient resistors include polysilicon resistors, thin-film metal alloy resistors (such as a nickel-chromium alloy), and thin-film metal mixture resistors (such as a silicon-chromium mixture). In one particular embodiment, resistor 310 is a polysilicon resistor with a temperature coefficient of between about 500-1000 ppm/° C. Current mirror 320 is an N-channel metal oxide semiconductor (MOS) transistor current mirror. Current mirror 330 is a P-channel MOS transistor current mirror. ICO 340 is a current controlled oscillator whose output frequency is linearly proportional to the input current. Using low temperature coefficient resistor 310, two MOS current mirrors, and a linear ICO, current controlled oscillator circuit 210 provides the FREQUENCY signal at a frequency that is linearly related to the value of $V_{DD}$ and generally temperature invariant.

Figure 4:
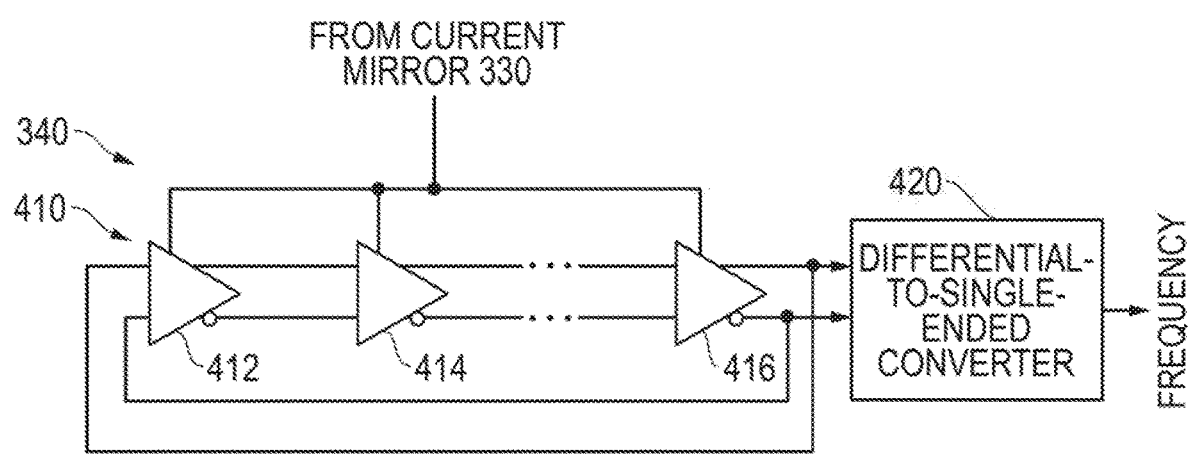
FIG. 4 illustrates in block diagram form the current controlled oscillator of FIG. 3 according to some embodiments.

FIG. 4 illustrates in block diagram form current controlled oscillator 340 of FIG. 3 according to some embodiments. Current controlled oscillator 340 includes generally an inverter chain 410, and a differential-to-single ended converter 420. Inverter chain 410 includes an odd number of differential inverters connected in series from a first differential inverter 412, to a second differential inverter 414, to a last differential inverter 416. Differential inverter 412 has a positive input, a negative input, a positive output, a negative output, and a current input connected to the output of current mirror 340. Differential inverter 414 has a positive input connected to the positive output of differential inverter 412, a negative input connected to the negative output of differential inverter 412, a positive output connected to the positive input of a subsequent differential inverter, a negative output connected to the negative input of the subsequent differential inverter, and a current input connected to the output of current mirror 340. Differential inverter 416 has a positive input connected to the positive output of a previous differential inverter, a negative input connected to the negative output of the previous differential inverter, a positive output connected to the positive input of differential inverter 412, a negative output connected to the negative input of differential inverter 412, and a current input connected to the output of current mirror 340. Differential to single-ended converter 420 has a positive input connected to the positive output of differential inverter 416, a negative input connected to the negative output of differential inverter 416, and an output for providing the FREQUENCY signal.

Current controlled oscillator 340 oscillates at a frequency linearly proportional to the input current received from current mirror 330 and ultimately linearly proportional to $V_{DD}$. It uses fully differential inverters such as differential inverters 412, 414, and 416 to provide manufacturing process independence. When implemented in CMOS technology, the differential inverters will compensate for an imbalance in the thresholds of the P-channel and N-channel transistors by using the differential inverter architecture, in which each differential inverter switches based on the differential component of the input and is relatively insensitive to the common mode component.

Figure 5:
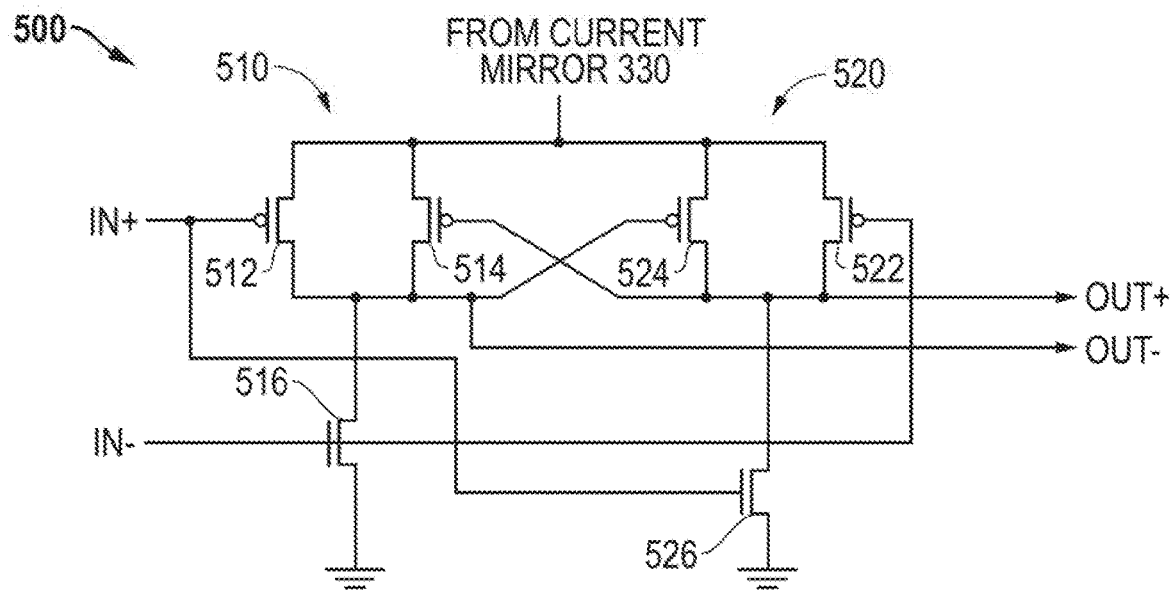
FIG. 5 illustrates in schematic form a differential inverter suitable for use in the current controlled oscillator of FIG. 4 according to some embodiments.

FIG. 5 illustrates in schematic form a differential inverter 500 suitable for use in current controlled oscillator 340 of FIG. 4 according to some embodiments. Differential inverter 500 includes generally a positive portion 510 and a negative portion 520.

Positive portion 510 includes P-channel transistors 512 and 514 and an N-channel transistor 516. Transistor 512 has a source connected to the output of current mirror 330, a gate for receiving a positive input signal labeled "IN+", and a drain for providing a negative output signal labeled "OUT−". Transistor 514 has a source connected to the output of current mirror 330, a gate, and a drain connected to the drain of transistor 512. Transistor 516 has a drain connected to the drains of transistors 512 and 514, a gate for receiving a negative input signal labeled "IN−", and a source connected to ground.

Negative portion 520 includes P-channel transistors 522 and 524 and an N-channel transistor 526. Transistor 522 has a source connected to the output of current mirror 330, a gate for receiving negative input signal IN−, and a drain connected to the gate of transistor 514. Transistor 524 has a source connected to the output of current mirror 330, a gate connected to the drains of transistors 512 and 524, and a drain connected to the drain of transistor 522. Transistor 526 has a drain connected to the drains of transistors 522 and 524 and to the gate of transistor 514, a gate for receiving input signal IN+, and a source connected to ground.

Differential inverter 500 uses complementary portions 510 and 520 and cross couples the outputs to provide not only symmetrical operation but also latching feedback. Thus differential inverter 500 switches sharply and without metastability in response to changes in the differential input represented by differential input signals IN+ and IN−. It is power supply insensitive and exhibits low power supply noise.

Figure 6:
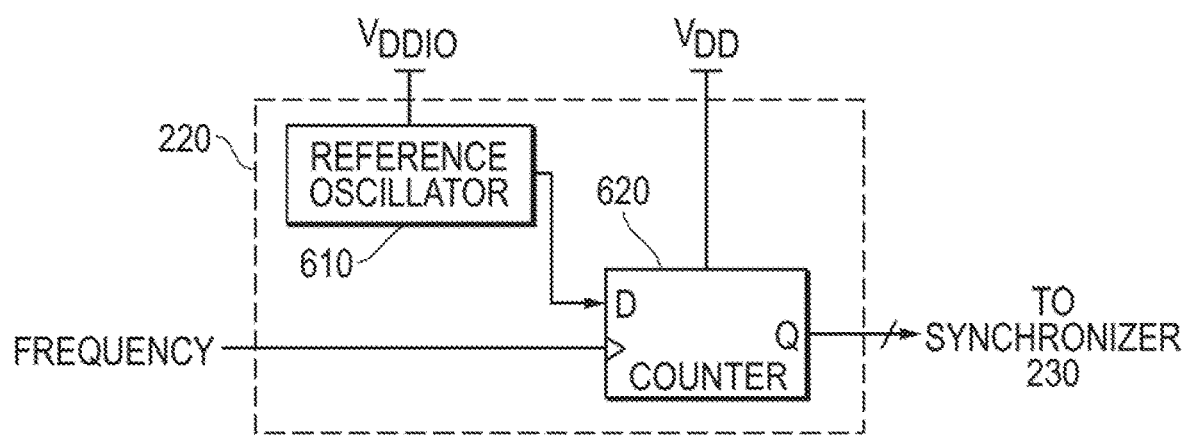
FIG. 6 illustrates in block diagram form a fast time-to-digital converter suitable for use in the power supply monitor of FIG. 2 according to some embodiments.

FIG. 6 illustrates in block diagram form a fast time-to-digital converter 600 suitable for use in power supply monitor 200 of FIG. 2 according to some embodiments. Time-to-digital converter 610 includes generally a reference oscillator 610 and a counter 620. Reference oscillator 610 has a power supply input for receiving a power supply voltage labeled "$V_{DDIO}$", and an output for providing a reference clock signal. Counter 620 has a data input labeled "D" connected to the output of reference oscillator 610, a clock input for receiving the FREQUENCY signal, a power supply input connected to $V_{DD}$, and an output for providing an unsynchronized clock signal to synchronizer 230 of FIG. 2.

In one form, reference oscillator 610 is a CMOS ring oscillator that receives power supply voltage $V_{DDIO}$, which is a power supply voltage that is fixed during operation. Thus reference oscillator 610 oscillates at a relatively high speed, for example 5 gigaHertz (GHz). However in order to reduce temperature dependence exhibited by an inverter-based ring oscillator, reference oscillator 610 may be implemented as a resonant inductor-capacitor (LC) oscillator or a resistor-capacitor (RC) oscillator whose frequency is set primarily by the values of the components and that is not sensitive to temperature.

Fast TDC 220 has a non-linear relationship between the frequency of the FREQUENCY signal and the output of counter 620. For example, assume that reference oscillator 510 provides an output at 5 GHz. If the FREQUENCY signal has a frequency of 2.0 GHz, then COUNT=2.5; if the frequency is 1 GHz, then count is 5, and so on. The transfer functions of the various components of power supply monitor 200 will now be described graphically.

Figure 7:
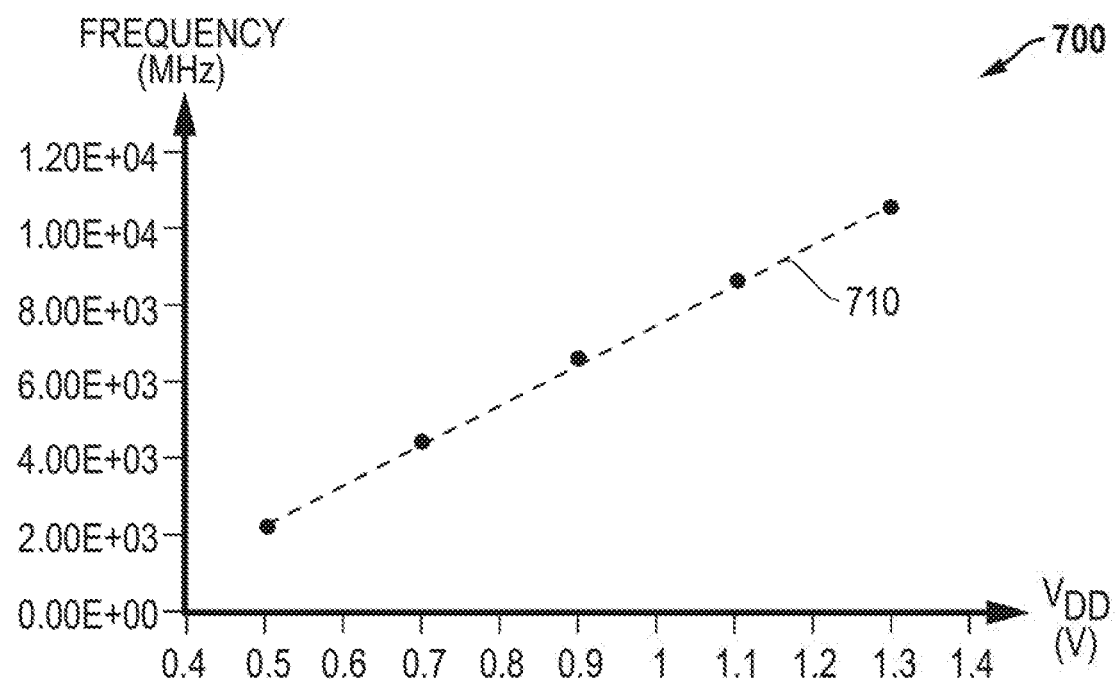
FIG. 7 illustrates a graph showing the voltage-to-frequency characteristic of the current controlled oscillator circuit of FIG. 2.

FIG. 7 illustrates a graph 700 showing the voltage-to-frequency characteristic 700 of current controlled oscillator circuit 210 of FIG. 2. In graph 700, the horizontal axis represents the level of $V_{DD}$ in volts, and the vertical axis the frequency of the FREQUENCY signal in megaHertz (MHz). The five data points of voltage-to-frequency characteristic 700 can be fit by a line described by the following equation:

$$y=a*x+b \quad [2]$$

in which x corresponds to $V_{DD}$ and y to the frequency in MHz, and a and b are coefficients that indicate the slope and offset of the line. For the example shown in FIG. 7, the closest-fit line has a coefficient of determination $R^2$ (a measure of how close the data are to the fitted regression line) equal to 0.9991, indicating that this relationship is highly linear.

Figure 8:
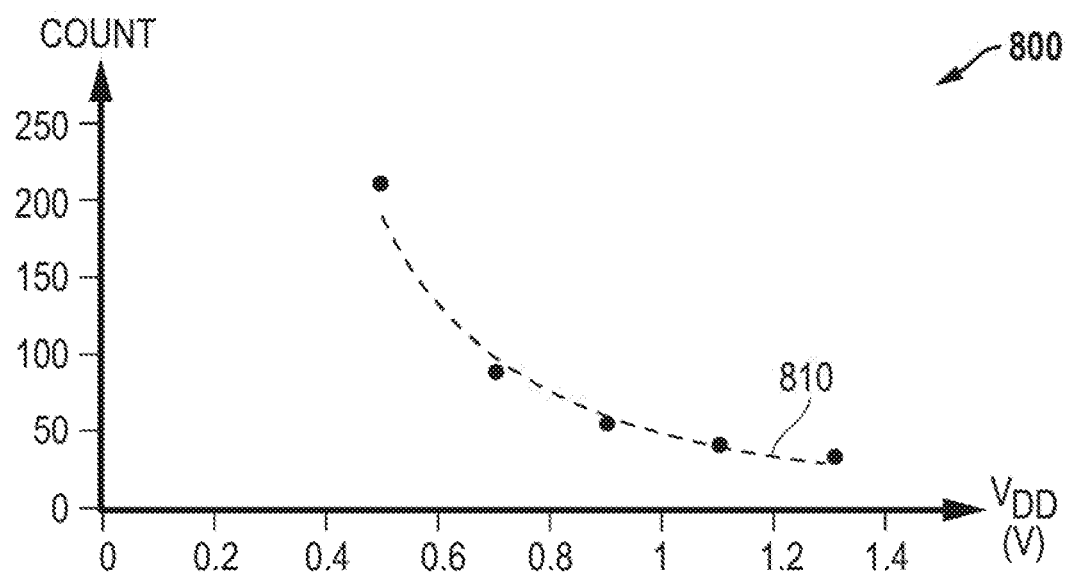
FIG. 8 illustrates a graph showing the voltage-to-count characteristic of the fast time-to-digital converter of FIG. 2.

FIG. 8 illustrates a graph 800 showing the voltage-to-count characteristic 810 of fast time-to-digital converter 220 of FIG. 2. In graph 800, the horizontal axis represents the level of $V_{DD}$ in volts, and the vertical axis the value of the COUNT signal in MHz. Fast TDC 220 inserts non-linearity into the overall transfer function. In this example the voltage-to-count characteristic can be fit by a curve having the transfer function:

$$y=c*x^n \quad [3]$$

in which x again corresponds to $V_{DD}$ and y to COUNT, and c and n are coefficients of the curve. For the example shown in FIG. 7, the closest-fit curve has a coefficient of determination $R^2=0.9811$.

Figure 9:
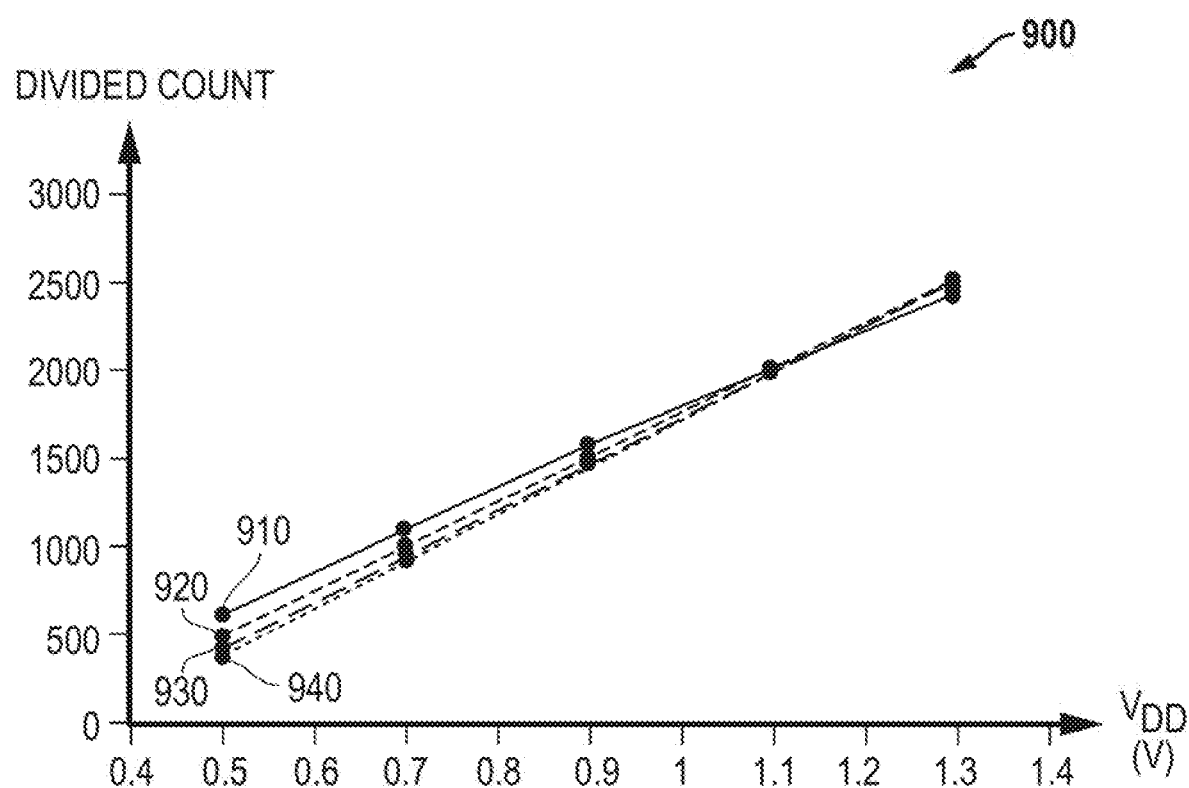
FIG. 9 illustrates a graph showing the voltage-to-divided count characteristic of the power supply monitor of FIG. 2.

FIG. 9 illustrates a graph 900 showing the voltage-to-divided count characteristic 910 of power supply monitor 200 of FIG. 2. In graph 900, the horizontal axis represents the level of $V_{DD}$ in volts, and the vertical axis the value of the DIVIDED COUNT. Shown in graph 900 is a set of lines 910, 920, 930, and 940 corresponding to junction temperatures of 125° C., 95° C., 50° C., and 0° C., respectively. An additional line for a junction temperature of −25° C. is substantially coincident with line 940 and is not shown separately in graph 900. The voltage-to-divided count characteristic 910 exhibits a highly linear relationship with very little variation over a large temperature range, and can be fit for a temperature of 125° C. by a curve having the transfer function:

$$y=a'*x+b' \quad [4]$$

in which x again corresponds to $V_{DD}$ and y to DIVIDED COUNT, and a' and b' are coefficients that indicate the slope and offset of the line. For the example shown in FIG. 7, the closest-fit curve has a coefficient determination $R^2=0.9989$. The linearity of the other curves is similarly high, and the family of curves is narrowly dispersed over the entire junction temperature range.

Thus, the power supply monitor 220 provides a highly linear voltage-to-divided count transfer function that is highly linear over its entire operating range, is insensitive to temperature variations, and does not require individual chip testing and fuses to store compensation coefficients. It provides low latency and can be used with other circuitry in a complex microprocessor or SOC to provide accurate power supply voltage monitoring and control.

Power supply monitor 200 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, various high-frequency oscillators can be used for the reference oscillator in a time-to-digital converter. These include a CMOS ring oscillator, a series-resonant LC oscillator, a parallel-resonant LC oscillator, and an RC oscillator. Moreover various current controlled oscillator circuits can be used. In current controlled oscillator circuits that are based on a resistor, the resistor can take various forms such as a polysilicon resistor, a thin-film metal alloy resistor, and a thin-film metal mixture resistor. Moreover the divider can use a variety of fixed numbers for the numerator.

Accordingly, it is intended by the appended claims to cover all modifications of the disclosed embodiments that fall within the scope of the disclosed embodiments.

What is claimed is:

1. A power supply monitor comprising:
a current controlled oscillator circuit having an input for receiving a power supply voltage to be measured, and an output for providing a frequency signal having a frequency linearly proportional to said power supply voltage;
a time-to-digital converter having an input coupled to said output of said current controlled oscillator circuit, and an output for providing a count signal representative of a number of cycles of a reference clock signal per cycle of said frequency signal, wherein said time-to-digital converter inserts a non-linearity into an overall transfer function of the power supply monitor; and
an output divider having an input coupled to said output of said time-to-digital converter, and an output for providing a divided count signal representative of a value of said power supply voltage, wherein said output divider provides said divided count signal by dividing a fixed number by said count signal, wherein said output divider corrects said non-linearity caused by said time-to-digital converter such that said overall transfer function of the power supply monitor is highly linear.

2. The power supply monitor of claim 1, wherein said current controlled oscillator circuit comprises:
a resistor having a first terminal for receiving said power supply voltage, and a second terminal;
a first current mirror having an input coupled to said second terminal of said resistor, and an output;
a second current mirror having an input coupled to said output of said first current mirror, and an output; and
a current-controlled oscillator having an input coupled to said output of said second current mirror, and an output for providing said frequency signal.

3. The power supply monitor of claim 2, wherein said resistor comprises a polysilicon resistor.

4. The power supply monitor of claim 2, wherein said current-controlled oscillator comprises:
an odd number of differential inverters coupled in series from a first differential inverter to a last differential inverter, each differential inverter having a power supply terminal coupled to said input of said current-controlled oscillator; and
a differential-to-single-ended converter having an input coupled to an output of said last differential inverter, and an output for providing said frequency signal.

5. The power supply monitor of claim 1, wherein said time-to-digital converter comprises:
a reference oscillator having an output for providing said reference clock signal; and
a counter having a power supply voltage terminal for receiving said power supply voltage to be measured, a data input coupled to said output of said reference oscillator, a clock input for receiving said frequency signal, and an output for providing said count signal.

6. The power supply monitor of claim 1, further comprising:
a synchronizer coupled between said output of said time-to-digital converter and said input of said output divider.

7. The power supply monitor of claim 1, wherein:
said output divider further has a clock input terminal for receiving a system management clock signal.

8. A power supply monitor comprising:
a resistor having a first terminal for receiving a power supply voltage to be measured, and a second terminal;
a first current mirror having an input coupled to said second terminal of said resistor, and an output;
a second current mirror having an input coupled to said output of said first current mirror, and an output; and
a current-controlled oscillator having an input coupled to said output of said second current mirror, and an output for providing a frequency signal;
a time-to-digital converter having an input coupled to said output of said current-controlled oscillator, and an output for providing a count signal representative of a number of cycles of a reference clock signal per cycle of said frequency signal, wherein said time-to-digital converter inserts a non-linearity into an overall transfer function of the power supply monitor; and
an output divider having an input coupled to said output of said time-to-digital converter, and an output for providing a divided count signal representative of a value of said power supply voltage, wherein said output divider provides said divided count signal by dividing a fixed number by said count signal, wherein said output divider corrects said non-linearity caused by said time-to-digital converter such that said overall transfer function of the power supply monitor is highly linear.

9. The power supply monitor of claim 8, wherein said resistor has a low temperature coefficient.

10. The power supply monitor of claim 9, wherein said resistor comprises a polysilicon resistor.

11. The power supply monitor of claim 8, wherein said current-controlled oscillator comprises:
an odd number of differential inverters coupled in series from a first differential inverter to a last differential inverter, each differential inverter having a power supply terminal coupled to said input of said current-controlled oscillator; and
a differential-to-single-ended converter having an input coupled to an output of said last differential inverter, and an output for providing said frequency signal.

12. The power supply monitor of claim 8, wherein said time-to-digital converter comprises:
a reference oscillator having an input for receiving a fixed power supply voltage, and an output for providing said reference clock signal; and
a counter having a power supply voltage terminal for receiving said power supply voltage to be measured, a data input coupled to said output of said reference oscillator, a clock input for receiving said frequency signal, and an output for providing said count signal.

13. The power supply monitor of claim 8, further comprising:
a synchronizer coupled between said output of said time-to-digital converter and said input of said output divider.

14. The power supply monitor of claim 8, wherein:
said output divider further has a clock input terminal for receiving a system management clock signal.

15. A method comprising:
receiving a power supply voltage to be measured;
generating a frequency signal having a frequency linearly proportional to said power supply voltage;
providing a count signal representative of a number of cycles of a reference clock signal per cycle of said frequency signal, wherein said providing comprises using a time-to-digital converter that inserts a non-linearity into an overall transfer function; and
dividing a fixed number by said count signal to provide a divided count signal representative of a value of said power supply voltage, wherein said dividing corrects said non-linearity caused by said providing said count signal using said time-to-digital converter such that said overall transfer function is highly linear.

16. The method of claim 15, wherein generating said frequency signal comprises:
providing a first current linearly proportional to said power supply voltage;
mirroring said first current to provide a second current;
mirroring said second current to provide a third current; and
generating said frequency signal in response to said third current.

17. The method of claim 16, wherein said providing said first current linearly proportional to said power supply voltage comprises generating said first current using said power supply voltage a resistor having a low temperature coefficient.

18. The method of claim 17, wherein said generating said first current using said power supply voltage a resistor having a low temperature coefficient comprises generating said first current using said power supply voltage a polysilicon resistor.

19. The method of claim 17, wherein said generating said frequency signal in response to said third current comprises:
successively inverting a differential signal using an odd number of differential inverters coupled in series from a first differential inverter to a last differential inverter, each differential inverter coupled to a first node that receives said third current; and
converting an output of said last differential inverter into a single-ended signal to form said frequency signal.

20. The method of claim 15, wherein said providing said count signal comprises:
providing said reference clock signal using a fixed power supply voltage; and
counting a number of cycles of a reference clock signal per cycle of said frequency signal to provide said count signal.

* * * * *